US008389990B2

(12) United States Patent
Mikawa et al.

(10) Patent No.: US 8,389,990 B2
(45) Date of Patent: Mar. 5, 2013

(54) NONVOLATILE SEMICONDUCTOR MEMORY DEVICE AND MANUFACTURING METHOD THEREOF

(75) Inventors: Takumi Mikawa, Shiga (JP); Yoshio Kawashima, Osaka (JP); Ryoko Miyanaga, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/485,203

(22) Filed: May 31, 2012

(65) Prior Publication Data

US 2012/0298945 A1 Nov. 29, 2012

Related U.S. Application Data

(62) Division of application No. 12/738,778, filed as application No. PCT/JP2008/002992 on Oct. 22, 2008, now Pat. No. 8,253,136.

(30) Foreign Application Priority Data

Oct. 30, 2007 (JP) ................................ 2007-281181

(51) Int. Cl.
*H01L 29/10* (2006.01)
(52) U.S. Cl. ........... 257/43; 257/2; 257/5; 257/E45.003; 438/104; 438/469; 365/148; 365/163
(58) Field of Classification Search ................ 257/2, 5, 257/43, E45.003; 438/104, 469; 365/148, 365/163
See application file for complete search history.

(56) References Cited

U.S. PATENT DOCUMENTS

| 5,929,524 | A | 7/1999 | Drynan et al. |
|---|---|---|---|
| 6,753,561 | B1 | 6/2004 | Rinerson et al. |
| 2003/0003674 | A1 | 1/2003 | Hsu et al. |
| 2004/0202041 | A1 | 10/2004 | Hidenori |
| 2004/0245557 | A1 | 12/2004 | Seo et al. |
| 2005/0162881 | A1 | 7/2005 | Stasiak et al. |
| 2006/0097288 | A1 | 5/2006 | Baek et al. |
| 2006/0098472 | A1 | 5/2006 | Ahn et al. |
| 2006/0215445 | A1 | 9/2006 | Baek et al. |
| 2007/0132049 | A1 | 6/2007 | Stipe |
| 2007/0153616 | A1* | 7/2007 | Kim et al. ................ 365/230.03 |
| 2008/0048226 | A1* | 2/2008 | Heo et al. ...................... 257/295 |
| 2008/0258129 | A1* | 10/2008 | Toda ................................ 257/5 |
| 2009/0065759 | A1 | 3/2009 | Kim |

FOREIGN PATENT DOCUMENTS

| JP | 9-167795 | 6/1997 |
|---|---|---|
| JP | 2003-68984 | 3/2003 |
| JP | 2004-319587 | 11/2004 |
| JP | 2004-363604 | 12/2004 |

(Continued)

*Primary Examiner* — Tom Thomas
*Assistant Examiner* — Farid Khan
(74) *Attorney, Agent, or Firm* — McDermott Will & Emery LLP

(57) ABSTRACT

A nonvolatile semiconductor memory device of the present invention includes a substrate (1), first wires (2), memory cells each including a resistance variable element (5) and a portion of a diode element (6), second wires (11) which respectively cross the first wires (2) to be perpendicular to the first wires (2) and each of which contains a remaining portion of the diode element (6), and upper wires (13) formed via an interlayer insulating layer (12), respectively, and the first wires (2) are connected to the upper wires (13) via first contacts (14), respectively, and the second wires (11) are connected to the upper wires (13) via second contacts (15), respectively.

5 Claims, 11 Drawing Sheets

FOREIGN PATENT DOCUMENTS

| | | |
|---|---|---|
| JP | 2005-522045 | 7/2005 |
| JP | 2005-217402 | 8/2005 |
| JP | 2005-285796 | 10/2005 |
| JP | 2006-140464 | 6/2006 |
| JP | 2006-140489 | 6/2006 |
| JP | 2006-279042 | 10/2006 |
| JP | 2007-165873 | 6/2007 |
| JP | 2007-184086 | 7/2007 |
| JP | 2007-281208 | 10/2007 |

* cited by examiner

NONVOLATILE SEMICONDUCTOR MEMORY DEVICE AND MANUFACTURING METHOD THEREOF

RELATED APPLICATIONS

This application is a Divisional of U.S. application Ser. No. 12/738,778, filed on Apr. 19, 2010, now U.S. Pat. No. 8,253,136 which is the U.S. National Phase under 35 U.S.C. §371 of International Application No. PCT/JP2008/002992, filed on Oct. 22, 2008, which in turn claims the benefit of Japanese Application No. 2007-281181, filed on Oct. 30, 2007, the disclosures of which Applications are incorporated by reference herein.

TECHNICAL FIELD

The present invention relates to a cross-point nonvolatile semiconductor memory device using a resistance variable layer. Particularly, the present invention relates to a configuration of a lead-out contact in a configuration in which a diode is integrated into a wire layer.

BACKGROUND ART

In recent years, with advancement of digital technologies of electronic hardware, semiconductor memory devices which have a large capacity and are nonvolatile have been developed vigorously to store data of music, image, information and so on. For example, a nonvolatile semiconductor memory device using a ferroelectric as a capacitive element has been already used in many fields. In addition to the nonvolatile memory device using such a ferroelectric capacitor, a nonvolatile semiconductor memory device (hereinafter referred to as ReRAM) using a material which is adapted to switch a resistance value in response to electric pulses applied and retains the state has attracted an attention because of its high compatibility with a standard semiconductor process.

For example, there is disclosed a device configuration of a ReRAM including one transistor and one memory section, for enabling the use of the existing DRAM based process as it is (see, for example, Patent document 1). The ReRAM includes a transistor and a nonvolatile memory section connected to a drain of the transistor. The memory section has a structure in which a resistance variable layer switching resistance reversibly in response to current pulses is sandwiched between an upper electrode and a lower electrode. As the resistance variable layer, a nickel oxide layer (NiO), a vanadium oxide layer ($V_2O_5$), a zinc oxide layer (ZnO), a niobium oxide layer ($Nb_2O_5$), a titanium oxide layer ($TiO_2$), a tungsten oxide layer ($WO_3$), a cobalt oxide layer (CoO), etc are used. It is known that such transition metal oxide layers exhibit a specified resistance value upon application of a voltage or current which is not lower than a threshold and retains the resistance value until a voltage or current is newly applied thereto. In addition, such the transition metal oxide layers have a feature that it can be manufactured using the existing DRAM based process as it is.

The above mentioned example has a configuration including one transistor and one nonvolatile memory section. A cross-point ReRAM using a perovskite structure material is disclosed (see, for example, patent document 2). In this ReRAM, stripe-shaped lower electrodes are formed on a substrate and an active layer is formed over the entire surface to cover the lower electrodes. As the active layer, a resistance variable layer which switches resistance reversibly in response to electric pulses is used. On the active layer, stripe-shaped upper electrodes are formed to respectively cross the lower electrodes such that the upper electrodes are perpendicular to the lower electrodes. A region where the lower electrode crosses the upper electrode with the active layer sandwiched between them is a memory section. Each of the lower electrode and the upper electrode serves as either a word line or a bit line. It is disclosed that such a cross-point configuration can achieve a larger capacity.

In the cross-point ReRAM, a diode is incorporated to be arranged in series with a resistance variable layer to avoid an influence of resistance variable layers belonging to other rows and columns, when reading a resistance value of the resistance variable layer formed at a cross point.

For example, a ReRAM is disclosed, comprising a substrate including two or more bit lines arranged in parallel with each other, two or more word lines which are arranged in parallel with each other so as to respectively cross the bit lines, resistive structures formed on the bit lines at positions where the bit lines respectively cross the word lines, and diode structures formed on the resistive structures in contact with the resistive structures and the word lines, lower electrodes formed on the substrate, resistive structures formed on the lower electrodes, diode structures formed on the resistive structures, and upper electrodes formed on the diode structures (see Patent document 3).

In such a configuration, a unit cell structure can be formed to have a layer structure including a single diode structure and a single resistive structure which are stacked continuously, and an array cell structure is easily attained.

Also, a cross-point ReRAM is disclosed, in which memory plugs are formed at cross points where X-direction conductive array lines 210 respectively cross Y-direction conductive array lines 215 (see e.g., Patent document 4). In Patent document 4, as shown in FIG. 11, the memory plug is composed of seven layers and contains therein a memory element 255 including a composite metal oxide 225 and two electrode layers 220 and 230 sandwiching the composite metal oxide 225, and a non-ohmic element 260 which is formed on the memory element 255 and has a metal-insulator-metal (MIM) structure consisting of a metal layer 235, an insulating layer 240 and a metal layer 245 which are stacked together such that the memory element 255 and the non-ohmic element 260 are provided via an electrode layer 250.

Patent document 1: Japanese Laid-Open Patent Application Publication No. 2004-363604
Patent document 2: Japanese Laid-Open Patent Application Publication No. 2003-68984
Patent document 3: Japanese Laid-Open Patent Application Publication No. 2006-140489
Patent document 4: U.S. Pat. No. 6,753,561 Specification

DISCLOSURE OF THE INVENTION

Problems to be Solved by the Invention

Patent document 1 also discloses a structure of a single diode having a switching function and a single resistive element, but fails to disclose or suggest a specific structure of the resistive element and the diode. Patent document 2 discloses the cross-point configuration, but fails to disclose or suggest series connection of the diode or its specific structure, as in Patent document 1.

In contrast to the above, Patent document 3 discloses a configuration in which a resistive structure is formed on a lower electrode, a diode structure is formed on the resistive structure, an upper electrode is formed on the diode structure, and the diode structure is formed of a p-type oxide and a n-type oxide which are made of NiO, $TiO_2$, and the like. However, since the diode structure disclosed in Patent document 3 is equal in outer dimension to the resistive structure, it is difficult to increase a current supply capability of the diode structure. If the current supply capability of the diode is small, the diode is incapable of flowing a current sufficient to perform writing, which impedes a stable operation of the ReRAM.

In the ReRAM of Patent document 4, since a resistance variable layer and a non-ohmic element having the MIM structure are all contained within a memory plug, the manufacturing method of it is complicated. In addition, in such a configuration, since the non-ohmic element has the same shape as the resistance variable layer, the current supply capability of the non-ohmic element cannot be increased. For this reason, the stable operation of the ReRAM is impeded, as in the above cases.

Prior to discovering the present invention, we proposed a cross-point structure for making an effective area of the diode element larger than the area of the resistive element by incorporating a portion of the diode element into the upper wire of the cross point, and achieved a ReRAM which is capable of ensuring a sufficient current supply capability and is operable stably in a cross-point configuration including a combination of the diode element and the resistance variable layer.

However, since the diode element is integrated into the wire structure to improve the current supply capability of the diode element, an insulating layer or a semiconductor layer is located in a lowermost layer of the wire. Therefore, a new problem that connection to lower wires like standard wires is difficult arises. To implement leading out of the potential from a peripheral circuit for driving a cross-point memory in addition to leading out of the potential from wires constituting the cross-point memory solving this problem is essential. As a solution to this, a mask used for forming the insulating layer or the semiconductor layer of the diode element only in a memory cell region may possibly be prepared in addition to a mask used for forming wires. By forming the insulating layer or semiconductor layer of the diode element only in the memory cell region using this mask, in other words, by removing the insulating layer or semiconductor layer of the diode element except for the memory cell region, connection of the upper wire to the lower wire is accomplished. However, one mask and process steps for removing the insulating layer or semiconductor layer of the diode element using the mask become necessary, for each individual wire in one layer. Particularly, in a multi-layer cross point structure, the number of masks and the number of steps significantly increase, making it difficult to simplify a process and reduce a process cost.

The present invention is directed to solving the above described new problem, and an object of the present invention is to provide a nonvolatile semiconductor memory device which can ensure a sufficient current supply capability in a cross-point configuration including a combination of the diode element and the resistance variable layer and lead out wires of a cross-point memory and wires of a peripheral circuit of the cross-point memory without making process steps complicated and without increasing the cost of the process.

Means for Solving the Problem

To achieve the above described object, a nonvolatile semiconductor memory device of the present invention comprises a substrate; first wires of a stripe shape which are formed on the substrate; a first interlayer insulating layer formed over the first wires; first memory cell holes formed in the first interlayer insulating layer on the first wires; first resistance variable layers which are connected to the first wires via the first memory cell holes, respectively; first non-ohmic elements formed on the first resistance variable layers, respectively; second wires of a stripe shape which are formed on the first interlayer insulating layer such that the second wires respectively cross the first wires so as to be perpendicular to the first wires; a second interlayer insulating layer formed over the second wires; and upper wires formed on the second interlayer insulating layer; wherein each of the second wires has a plurality of layers including at least a portion of the first non-ohmic element and has a semiconductor layer or an insulator layer in a lowermost layer of the second wire; wherein each of the first wires is connected to the upper wire via a first contact penetrating the first interlayer insulating layer and the second interlayer insulating layer; and wherein each of the second wires is connected to the upper wire via a second contact penetrating the second interlayer insulating layer.

In such a configuration, since the first wire and the second wire are led out to the upper wire which is the upper layer of them, the first wire and the second wire can be connected to each other via the upper wire as desired without the contact used for directly connecting the first wire to the second wire. Therefore, it is possible to attain a nonvolatile semiconductor memory device which can ensure a sufficient current supply capability in the cross-point configuration including a combination of the diode element and the resistance variable layer, and can lead out a wire potential of a cross-point memory of a single-layer structure.

To achieve the above described object, a nonvolatile semiconductor memory device of the present invention comprises a substrate; first wires of a stripe shape which are formed on the substrate; a first interlayer insulating layer formed over the first wires; first memory cell holes formed in the first interlayer insulating layer on the first wires; first resistance variable layers which are connected to the first wires via the first memory cell holes, respectively; first non-ohmic elements formed on the first resistance variable layers, respectively; second wires of a stripe shape which are formed on the first interlayer insulating layer such that the second wires respectively cross the first wires to be perpendicular to the first wires; a second interlayer insulating layer formed over the second wires; a third interlayer insulating layer formed over the second interlayer insulating layer; second memory cell holes penetrating the second interlayer insulating layer and the third insulating layer on the second wires; second resistance variable layers connected to the second wires via the second memory holes, respectively; second non-ohmic elements formed on the second resistance variable layers, respectively; third wires of a stripe shape which are formed on the third interlayer insulating layer such that the third wires respectively cross the second wires so as to be perpendicular to the second wires; a fourth interlayer insulating layer formed over the third wires; and upper wires formed on the fourth interlayer insulating layer; wherein each of the second wires has a plurality of layers including at least a portion of the first non-ohmic element and has a semiconductor layer or an insulator layer in a lowermost layer of the second wire, and each of the third wires has a plurality of layers including at least a portion of the second non-ohmic element and has a semiconductor layer or an insulator layer in a lowermost layer of the third wire; wherein each of the first wires is connected to the upper wire via a stacked contact including a first contact penetrating the first interlayer insulating layer and the second interlayer insulating layer and a third contact penetrating the third interlayer insulating layer and the fourth interlayer insulating layer, the first contact and the third contact being stacked together; wherein each of the second wires is connected to the upper wire via a stacked contact including a second contact penetrating the second interlayer insulating layer and the third contact penetrating the third interlayer insulating layer and the fourth interlayer insulating layer, the second contact and the third contact being stacked together; and wherein each of the third wires is connected to the upper wire via a fourth contact penetrating the fourth interlayer insulating layer.

In such a configuration, since the first wire, the second wire and the third wire are led out to the upper wire which is the upper layer of them, the first wire, the second wire and third wire can be connected to each other via the upper wire as desired without contacts used for directly connecting the first wire, the second wire and third wire. Since a lead-out contact for connecting the second and third wires having the semiconductor layer or the insulating layer which is its lowermost layer to the underlying layer cannot be formed, electric connection between these wires is accomplished only via the upper wire, with the structure of the present invention. Therefore, it is possible to attain a nonvolatile semiconductor memory device which can ensure a sufficient current supply capability in the cross-point configuration including a combination of the diode element and the resistance variable layer and can lead out a wire potential of a cross-point memory of a two-layer structure.

The nonvolatile semiconductor memory device may further comprise: one or more constituent units being stacked together, each of the constituent units including the second interlayer insulating layer, the third interlayer insulating layer, the second resistance variable layer and the second non-ohmic element which are filled into the second memory cell hole, and the third wire. Intermediate wires other than the upper wire and a lowermost wire may be electrically connected to each other only via the upper wire.

In such a configuration, since the wires except for the upper wire is connected to the upper wire via contacts stacked in the form of one or more layers, these wires can be connected to each other via the upper wire as desired without the contacts used for directly connecting these wires. In addition, since a lead-contact for connecting the intermediate wire having the semiconductor layer or the insulating layer as its lowermost layer to an underlying layer cannot be formed, electric connection between these wires is accomplished only via the upper wire, with structure of the present invention. This makes it possible to omit a mask and process steps for removing predetermined regions of the semiconductor layer or the insulating layer, for each individual layer. Therefore, it is possible to attain a nonvolatile semiconductor memory device which can ensure a sufficient current supply capability in the cross-point configuration including a combination of the diode element and the resistance variable layer and can lead out a wire potential of a cross-point memory of a multi-layer structure, without making the process complicated and increasing the cost of the process.

In the above configuration, the first wire may include a wire connected to the first resistance variable layer and a wire connected to a transistor in a layer underlying the first wire.

In such a configuration, the potential of the transistor for peripheral circuit for driving the cross-point memory array and the potential of the wires can be surely led out by the lead-out contact, or the stacked contact in the multi-layer structure of the present invention. Therefore, it is possible to attain a nonvolatile semiconductor memory device which can ensure a sufficient current supply capability in the cross-point configuration including a combination of the diode element and the resistance variable layer and can lead out the wire of the peripheral circuit of the cross-point memory array, in addition to the wire of the cross-point memory array, without making the process steps complicated and increasing the cost of the process.

In the above configuration, the stacked contact including the contacts stacked in the form of one or more layers may be configured such that the contacts may be connected to each other at a height position which is between upper and lower wire layers. That is, the stacked contact has a structure in which the upper contact and the lower contact are connected in the interlayer insulating layer sandwiched between different wire layers.

In such a configuration, the surface of the lower contact of the stacked contact is covered with the interlayer insulating layer when forming the cross-point memory cell, the structure is not subjected to damage in process (change property of layer due to plasma damage, oxidation and cleaning), in principle. Therefore, contacts which are electrically stable can be surely formed without a possibility of change property of the surface of the lower contact due to oxidation or cleaning, when forming the stacked contact. As a result, a yield of the nonvolatile memory device can be improved. Since the contacts stacked to sandwich the wire between them increase in size because of allowance for mask alignment between the contacts and the wire, which is unsuitable for miniaturization. To form the contacts without increasing their sizes, it is necessary to set a distance between these contacts and adjacent wires smaller, which has a drawback that wire delay and noise due to an increase in an inter-wire capacitance are likely to occur. In the present configuration, it is possible to attain a nonvolatile memory device including electrically stable contacts without such problems associated with the device.

In the above configuration, each of the non-ohmic elements may be a MSM diode having a three-layer structure including a semiconductor layer, and upper and lower metal electrode layers sandwiching the semiconductor layer, and one of the upper and lower metal electrode layers which is closer to the resistance variable layer may be filled into the memory cell hole.

With such a MSM diode configuration, it is possible to easily attain a non-ohmic element which has a large bidirectional current supply capability and has a characteristic with less variation, even when it is used with so-called a bipolar resistance variable layer which switches resistance in response to positive and negative voltages applied.

In the above configuration, each of the non-ohmic elements may be a Schottky diode having a two-layer structure including a semiconductor layer and a metal electrode layer, and the metal electrode layer may be filled into the memory cell hole. In the case of the configuration of the Schottky diode, since major carriers are dominant, a current supply capability can be increased and a high-speed operation can be achieved. This configuration is suitable for so-called a unipolar resistance variable layer which switches resistance in response to voltages with the same polarity and different magnitudes.

The non-ohmic element may be a pn junction diode having a two-layer structure including a p-type semiconductor layer and a n-type semiconductor layer, and one of the p-type semiconductor layer or the n-type semiconductor layer may be filled into the memory cell hole. Although the current supply capability of the pn junction diode is smaller than that of the above mentioned diodes because minor carriers are dominant in the pn junction diode, it is expected that an excess current is prevented and electric power consumption is reduced in the pn junction diode. This configuration is suitable for so-called a unipolar resistance variable layer which switches resistance in response to voltages with the same polarity and different magnitudes.

As explained above, by utilizing a current steering characteristic in the configuration using the diode element, cross talk when writing and reading data can be further reduced. In addition, a circuit configuration therefor can be simplified.

A method of manufacturing a nonvolatile semiconductor memory device of the present invention comprises the steps of: forming first wires of a stripe shape on a substrate; forming a first interlayer insulating layer over the substrate provided with the first wires; forming first memory cell holes in predetermined positions of the first interlayer insulating layer on the first wires; respectively; filling first resistance variable layers into the first memory cell holes, respectively; filling at least one layer of a layer structure forming a first non-ohmic element on each of the first resistance variable layers which are filled into the first memory cell holes, respectively; forming second wires on the first interlayer insulating layer such that each of the second wires covers at least a portion of the first memory cell hole, each of the second wires including other layer of the layer structure forming the first non-ohmic element; forming a second interlayer insulating layer over the first interlayer insulating layer provided with the second wires; forming first contacts on the first wires such that each of first contacts penetrates the first interlayer insulating layer and the second interlayer insulating layer and second contacts on the second wires such that each of the second contacts penetrates the second interlayer insulating layer, the first contacts and the second contacts being formed concurrently; and forming upper wires on the second interlayer insulating layer such that each of the upper wires is connected to the first contact and the second contact.

In such a method, since the first wire and the second wire are led out to the upper wire which is the upper layer without a contact used for directly connecting the first wire to the second wire, the first wire and the second wire can be connected to each other via the upper wire as desired. In addition, since the first contact and the second contact are formed concurrently, the number of masks and the process cost can be reduced, and the process can be simplified. With the above manufacturing method, it is possible to attain a nonvolatile semiconductor memory device which can ensure a sufficient current supply capability in the cross-point configuration including a combination of the diode element and the resistance variable layer and can lead out a wire potential of a cross-point memory of a single-layer structure.

A method of manufacturing a nonvolatile semiconductor memory device comprises the steps of: forming first wires of a stripe shape on a substrate; forming a first interlayer insulating layer over the substrate provided with the first wires; forming first memory cell holes in predetermined positions of the first interlayer insulating layer on the first wires, respectively; filling first resistance variable layers into the first memory cell holes, respectively; filling at least one layer of a layer structure forming a first non-ohmic element on each of the first resistance variable layers which are filled into the first memory cell holes, respectively; forming second wires on the first interlayer insulating layer such that each of the second wires covers at least a portion of the first memory cell hole, each of the second wires including other layer of the layer structure forming the first non-ohmic element; forming a second interlayer insulating layer over the first interlayer insulating layer provided with the second wires; forming first contacts on the first wires such that each of the first contacts penetrates the first interlayer insulating layer and the second interlayer insulating layer and second contacts on the second wires such that each of the second contacts penetrates the second interlayer insulating layer, the first contacts and the second contacts being formed concurrently; forming a third interlayer insulating layer over the second interlayer insulating layer, surfaces of the first contacts and surfaces of the second contacts; forming second memory cell holes in predetermined positions on the second wires such that each of the second memory cell holes penetrates the second interlayer insulating layer and the third interlayer insulating layer; filling second resistance variable layers into the second memory cell holes, respectively; filling at least one layer of a layer structure forming a second non-ohmic element on each of the first resistance variable layers which are filled into the second memory cell holes, respectively; forming third wires on the third interlayer insulating layer such that each of the third wires covers at least a portion of the second memory cell hole, each of the third wires including other layer of the layer structure forming the second non-ohmic element; forming a fourth interlayer insulating layer over the third interlayer insulating layer provided with the third wires; and forming third contacts penetrating the third interlayer insulating layer and the fourth interlayer insulating layer over the first contacts and the second contacts, and fourth contacts penetrating the fourth interlayer insulating layer over the third wires such that the third contacts and the fourth contacts are formed concurrently; and forming upper wires on the fourth interlayer insulating layer such that each of the upper wires is connected to the third contact and the fourth contact.

In such a method, since the first wire, the second wire and the third wire are led out to the upper wire which is the upper layer without contacts used for directly connecting the first wire, the second wire and third wires, respectively, the first wire, the second wire and third wire can be connected to each other via the upper wire as desired. In addition, since the first contact and the second contact are formed concurrently and the third contact and the fourth contact are formed concurrently, the number of masks and the process cost can be reduced and the process can be simplified. Since the surface of the lower contact of the stacked contact is covered with the interlayer insulating layer when forming the cross-point memory, this structure is not subjected to the damage in process (change property of layer due to plasma damage, oxidation and cleaning), in principle. Therefore, when forming the stacked contact, the contacts which are electrically stable can be surely formed without a possibility of change property of the surface of the first contact and the surface of the second contact which would otherwise occur due to oxidation or cleaning. As a result, a yield of the nonvolatile semiconductor memory device can be improved.

The above and further objects, features and advantages of the present invention will more fully be apparent from the following detailed description of preferred embodiments with accompanying drawings.

Effects of the Invention

The present invention is directed to solving the above described new problem, and achieves advantages that a sufficient current supply capability can be ensured in a cross-point configuration including a combination of a diode element and a resistance variable layer, and can lead out a wire of a cross-point memory array and lead out a wire of a peripheral circuit of the cross-point memory array without making a process complicated and increasing the cost of the process.

Figure 1:
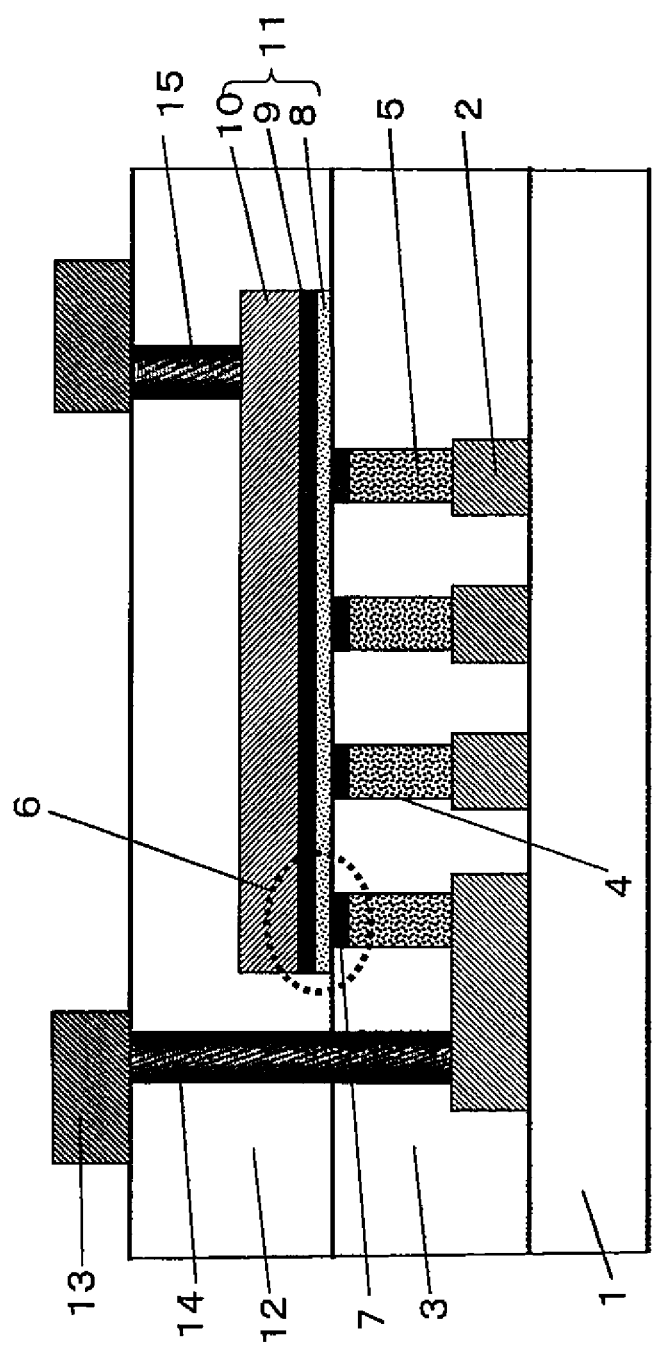
FIG. 1 is a cross-sectional view of a cross-point memory array of a single-layer structure according to Embodiment 1 of the present invention.

DESCRIPTION OF THE REFERENCE NUMERALS 1 substrate
2 first wire
2A first wire of memory cell region
2B first wire of peripheral circuit region
3 first interlayer insulating layer
4 first memory cell hole
5 first resistance variable layer
6 first diode element (MSM diode)
6A first diode element (Schottky diode)
6B first diode element (pn junction diode)
7 lower electrode of first diode element (MSM diode)
7A metal electrode of first diode element (Schottky diode)
7B n-type semiconductor layer of first diode element (pn junction diode)
8 semiconductor layer of first diode element (MSM diode)
8A semiconductor layer of first diode element (Schottky diode)
8B p-type semiconductor layer of first diode element (pn junction diode)
9 upper electrode of first diode element (MSM diode)
10 conductive layer of second wire which has low resistivity
11 second wire (including a portion of MSM diode)
11A second wire (including a portion of Schottky diode)
11B second wire (including a portion of pn junction diode)
12 second interlayer insulating layer
13 upper wire connected to lead-out contact
14 first contact
15 second contact
16 third interlayer insulating layer
17 second memory cell hole
18 second resistance variable layer
19 second diode element (MSM diode)
20 lower electrode of second diode element (MSM diode)
21 semiconductor layer of second diode element (MSM diode)
22 upper electrode of second diode element (MSM diode)
23 conductive layer of third wire which has low resistivity.
24 third wire
25 fourth interlayer insulating layer
26 third contact
27 fourth contact
28 semiconductor layer of (N−1)-th diode element (MSM diode)
29 upper electrode of (N−1)-th diode element (MSM diode)
30 conductive layer of N-th wire which has low resistivity
31 N-th wire
32 (2N−1)-th interlayer insulating layer
33 2N-th interlayer insulating layer
34 N-th memory cell hole
35 N-th resistance variable layer
36 N-th diode element (MSM diode)
37 lower electrode of N-th diode element (MSM diode)
38 conductive layer of (N+1)-th diode element which has low resistivity
39 upper electrode of N-th diode element (MSM diode)
40 semiconductor layer of N-th diode element (MSM diode)
41 (N+1)-th wire
42 (2N+1)-th interlayer insulating layer
43 (2N−1)-th contact
44 2N-th contact
45 (2N+1)-th contact
46 (2N+2)-th contact
47 contact between wire and transistor
48 transistor (gate electrode)
49 interlayer insulating layer between wire and substrate

BEST MODE FOR CARRYING OUT THE INVENTION

Hereinafter, embodiments of the present invention will be described with reference to the drawings. The same constituents are identified by the same reference numerals and will not be described repetitively. In addition, the shapes of transistors, memory sections and others are schematically drawn and the numbers of them are set for easy illustration.

Embodiment 1

FIG. 1 is a cross-sectional view showing a configuration of a nonvolatile semiconductor memory device according to Embodiment 1 of the present invention.

The nonvolatile semiconductor memory device of this Embodiment includes a substrate 1, first wires 2 of a stripe shape which are formed on the substrate 1, a first interlayer insulating layer 3 formed over the substrate 1 to cover the first wires 2, second wires 11 of a stripe shape which are formed on the first interlayer insulating layer 3 such that the second wires 11 respectively cross the first wires 2 so as to be perpendicular to the first wires 2, a second interlayer insulating layer 12 formed over the first interlayer insulating layer 3 to cover the second wires 11, and upper wires 13 formed on the second interlayer insulating layer 12. First memory cell holes 4 are formed in regions of the first interlayer insulating layer 3 where the first wires 2 cross the second wires 11, respectively. Inside each first memory cell hole 4, a first resistance variable layer 5 connected to the first wire 2 and a lower electrode 7 of first diode element which is formed on the first resistance variable layer 5 are provided. Each second wire 11 includes a semiconductor layer 8 of first diode element, an upper electrode 9 of first diode element and a conductive layer 10 of second wire which has low resistivity. A first diode element 6 (MSM diode) is composed of the lower electrode 7 of first diode element, the semiconductor layer 8 of first diode element and the upper electrode 9 of first diode element. The first wire 2 is connected to the upper wire 13 via a first contact 14 penetrating the first interlayer insulating layer 3 and the second interlayer insulating layer 12. The second wire 11 is connected to the upper wire 13 via a second contact 15 penetrating the second interlayer insulating layer 12.

In the above configuration, it is preferable that the first wire 2, the conductive layer 10 of second wire which has low resistivity, and the upper wire 13 are formed of a conductive layer (thickness: 100 nm~500 nm) with low resistivity which is made of, for example, copper or aluminum or a structure in which a barrier metal (thickness: 5 nm~100 nm) such as titanium nitride, titanium, tantalum nitride or tantalum is stacked on a layer underlying the conductive layer. The former is directed to lowering the resistance of the wire so that a delay of a circuit operation is prevented and a high-speed operation is achieved, while the latter is directed to preventing diffusion of impurities from the interlayer insulating layers and improving adhesiveness to the interlayer insulating layers.

As the first diode element 6 incorporated into the second wire 11, used is a MSM diode having a configuration in which, for example, one of tantalum, tantalum nitride, titanium, titanium nitride, aluminum, tungsten, platinum, and copper or a combination of these is used for the lower electrode 7 of first diode element and the upper electrode 9 of first diode element, and one of silicon, silicon nitride, and silicon carbide is used for the semiconductor layer 8 such that these materials are stacked together. It is preferred that the thicknesses of the lower electrode 7 and upper electrode 9 of first diode element fall within a range of 5 nm~20 nm and the thickness of the semiconductor layer 8 of first diode element falls within a range of 3~15 nm. It is preferable that the semiconductor layer 8 of the first diode element 6 is larger in size than the lower electrode 7 of first diode element which is filled into the first memory cell hole 4, in order to increase the current supply capability of the diode element. With such a MSM diode configuration, it is possible to easily attain a non-ohmic element which has a large bidirectional current supply capability and has a characteristic with less variation, even when it is used with so-called a bipolar resistance variable layer which switches resistance in response to positive and negative voltages applied.

As the first insulating layer 3 and the second interlayer insulating layer 12, insulative oxide materials may be used. To be specific, a silicon oxide (SiO) deposited by the CVD process, or a TEOS-SiO layer deposited using ozone ($O_3$) and tetraethoxysilane (TEOS) by the CVD process, or a silicon nitride (SiN) layer may be used. Alternatively, silicon carbon nitride (SiCN) layer or silicon oxycarbite (SiOC) layer which is a low-dielectric constant material, fluorine-doped silicon oxide (SiOF) layer, etc may be used. It is preferable that the thickness of the first interlayer insulating layer 3 and the thickness of the second interlayer insulating layer 12 are about 100~500 nm. This is because as an inter-wire insulating layer is thinner, an inter-wire leak current increases more, while as the inter-wire insulating layer is thicker, the first contact is deeper and is more difficult to process.

As the first resistance variable layer 5, transition metal oxides, for example, iron oxide such as triiron tetraoxide ($Fe_3O_4$), titanium oxide, tantalum oxide, vanadium oxide, cobalt oxide, nickel oxide, zinc oxide, or niobium oxide layer, may be formed by the sputtering process or the like. Such a transition metal oxide material is allowed to exhibit a specific resistance value when it is applied with voltages or currents which are not lower than thresholds and retains the resistance value until it is newly applied with a pulse voltage or pulse current having a constant magnitude. Although in this Embodiment, the first resistance variable layer 5 is filled into the first memory cell hole 4, it may be formed on only a bottom portion or side walls of the first memory cell hole 4, for example.

Each of the first contact 14 and the second contact 15 has a layer structure, in which tungsten or copper and a combination of titanium, titanium nitride, tantalum and tantalum nitride underlying the tungsten or copper are filled into each contact hole. This can achieve lead-out contacts with a low contact resistance. It is preferable that the second contact 15 is formed on the second wire 11 except a region right above the first memory cell hole 4, to prevent an influence of plasma damage when forming the second contact 15.

In the above described configuration, since the first wire 2 and the second wire 11 are led out to the upper wire 13 which is the upper layer, the first wire 2 and the second wire 11 can be connected to each other via the upper wire as desired without a contact used for directly connecting the first wire 2 to the second wire 11. Therefore, it is possible to attain a nonvolatile semiconductor memory device which can ensure a sufficient current supply capability in the cross-point configuration including a combination of the diode element and the resistance variable layer and can lead out the wire potential of the cross-point memory of a single-layer structure.

Embodiment 2

Figure 2:
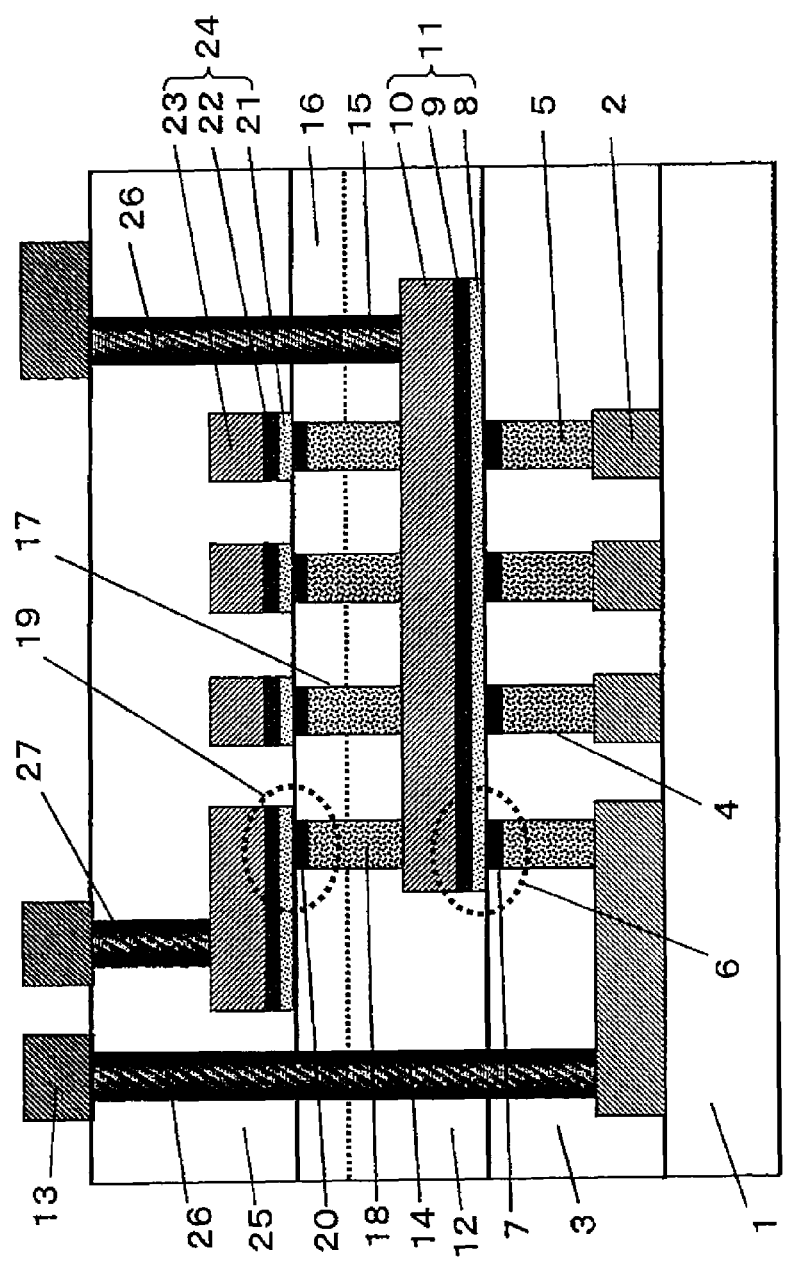
FIG. 2 is a cross-sectional view of a cross-point memory array of a two-layer structure according to Embodiment 2 of the present invention.

FIG. 2 is a cross-sectional view showing a configuration of a nonvolatile semiconductor memory device according to Embodiment 2 of the present invention. Embodiment 2 is different from Embodiment 1 in that a second layer structure of the cross-point memory is stacked on the second interlayer insulating layer 12 instead of the lead-out upper wires 13. The constituents common to Embodiment 1 and Embodiment 2 will not be described repetitively in this Embodiment. The nonvolatile semiconductor memory device includes, in addition to the constituents of Embodiment 1, a third interlayer insulating layer 16 which is formed over the entire surface of the second interlayer insulating layer 12 to cover the first contacts 14 and the second contacts 15, stripe-shaped third wires 24 formed on the third interlayer insulating layer 16 such that the third wires 24 respectively cross the second wires 11 so as to be perpendicular to the second wires 11, and a fourth interlayer insulating layer 25 formed over the third interlayer insulating layer 16 to cover the third wires 24, and the upper wires 13 formed on the fourth interlayer insulating layer 25. Second memory cell holes 17 are respectively formed to penetrate the second interlayer insulating layer 12 and the third interlayer insulating layer 16 in regions where the second wires 11 respectively cross the third wires 24 so as to be perpendicular to the third wires 24. Inside each memory cell hole 17, a second resistance variable layer 18 connected to the second wire 11 and a lower electrode 20 of second diode element which is formed on the second resistance variable layer 18 are provided. Each third wire 24 is composed of a semiconductor layer 21 of second diode element, an upper electrode 22 of second diode element, and a conductive layer 23 of third wire which has low resistivity. A second diode element 19 (MSM diode) is composed of the lower electrode 20 of second diode element, the semiconductor layer 21 of second diode element, and the upper electrode 22 of second diode element. The first wire 2 is connected to the upper wire 13 via a stacked contact including the first contact 14 penetrating the first interlayer insulating layer 3 and the second interlayer insulating layer 12 and a third contact 26 penetrating the third interlayer insulating layer 16 and the fourth interlayer insulating layer 25 such that the first contact 14 and the third contact 26 are stacked together. The second wire 11 is connected to the upper wire 13 via a stacked contact including the second contact 15 penetrating the second interlayer insulating layer 12 and the third contact 26 penetrating the third interlayer insulating layer 16 and the fourth interlayer insulating layer 25 such that the second contact 15 and the third contact 26 are stacked together. The third wire 24 is connected to the upper wire 13 via the fourth contact 27 penetrating a fourth interlayer insulating layer 25.

In such a configuration, since the first, second, and third wires can be led out to the upper wire 13 which is the upper layer, the first, second, and third wires can be connected to each other via the upper wire as desired, without the contacts used for directly connecting the first, second and third wires to each other. Since a lead-out contact used for connecting the second and third wires having the semiconductor layer or insulating layer which is its lowermost layer to the underlying layer cannot be formed, electric connection between these wires is accomplished only via the upper wire, with the structure of the present invention. Therefore, it is possible to attain a nonvolatile semiconductor memory device which can ensure a sufficient current supply capability in the cross-point configuration including a combination of the diode element and the resistance variable layer, and can lead out a wire potential of a cross-point memory of a two-layer structure.

Furthermore, since the exposed surfaces of the first contact 14 and the second contact 15 which are lower contacts of the stacked contact are covered with the third interlayer insulating layer 16, the structure is not subjected to damage in process (change property of layer due to plasma damage, oxidation or cleaning) due to dry etching or the like, for forming the second memory cell holes 17 and the third wires 24, in principle. Therefore, when forming the stacked contact, contacts which are electrically stable can be surely formed without a possibility of change property of the surface of the first contact 14 or the surface of the second contact 15 which would otherwise occur due to oxidation or cleaning. As a result, a yield of the nonvolatile memory device can be improved. Since the contacts stacked to sandwich the wire between them increase in size because of allowance for mask alignment between the contacts and the wire, which is unsuitable for miniaturization. To form the contacts without increasing their sizes, it is necessary to set a distance between these contacts and adjacent wires smaller, which has a drawback that wire delay and noise due to an increase in an inter-wire capacitance are likely to occur. In this configuration, it is possible to attain a nonvolatile memory device including electrically stable contacts without such problems associated with the device.

Since the second diode element 19 including the lower electrode 20, the semiconductor layer 21, and the upper electrode 22, the conductive layer 23 of third wire which has low resistivity, the third interlayer insulating layer 16, the fourth interlayer insulating layer 25, the second resistance variable layer 18, the third contact 26 and the fourth contact 27 are identical in specific configuration to those described in Embodiment 1, they will not be described repetitively in this Embodiment.

Embodiment 3

Figure 3:
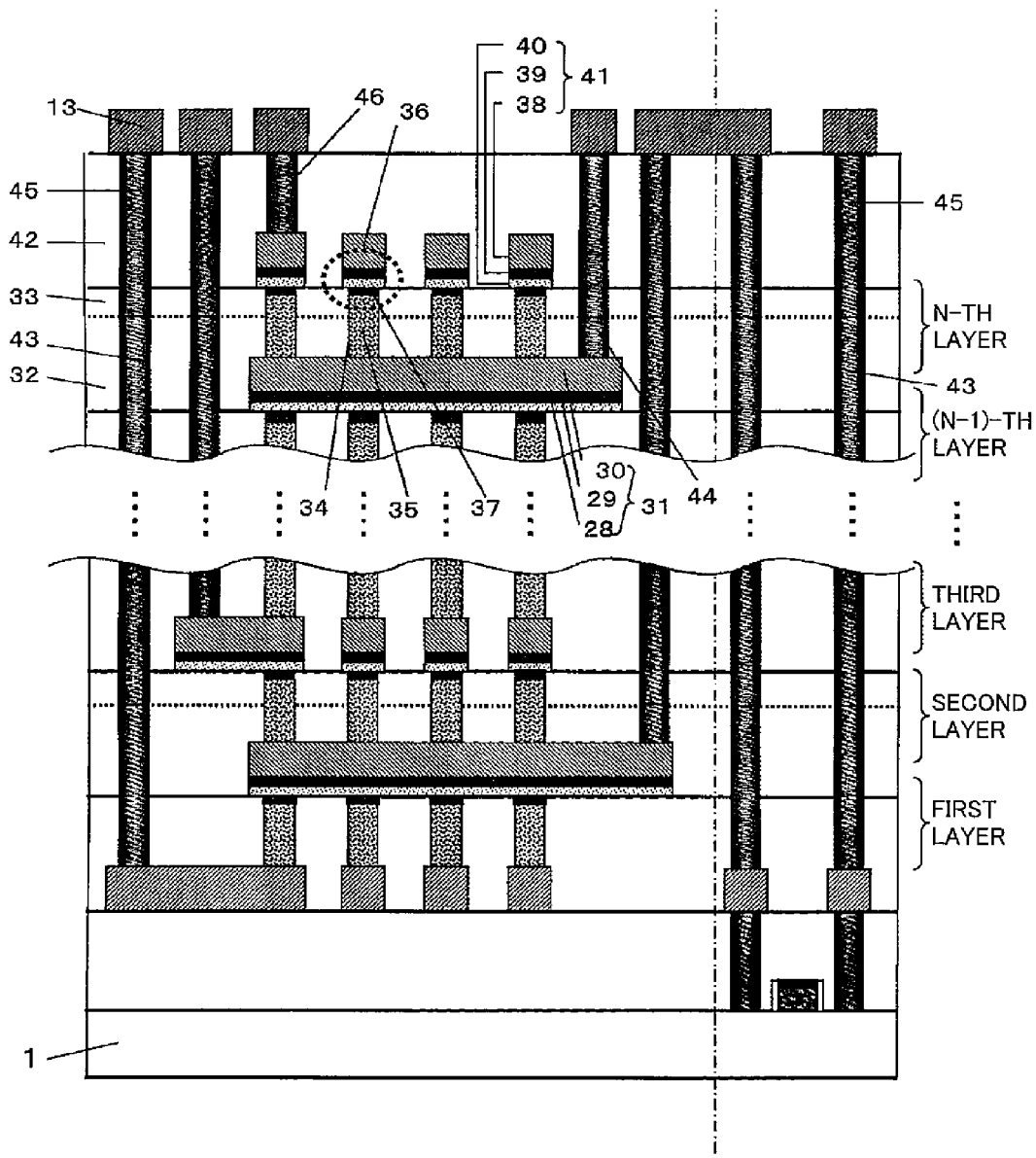
FIG. 3 is a cross-sectional view of a cross-point memory array of a multi-layer structure according to Embodiment 3 of the present invention.

FIG. 3 is a cross-sectional view showing a configuration of a nonvolatile semiconductor memory device according to Embodiment 3 of the present invention. Embodiment 3 is different from Embodiment 2 in that third and the following layer structures of cross-point memory array are stacked on the fourth interlayer insulating layer 25 in place of the lead-out upper wires 13. The constituents common to Embodiment 1, Embodiment 2 and Embodiment 3 will not be described repetitively in this Embodiment. The cross-point memory array of a N-th (N is an integer of 3 or larger) layer of the nonvolatile semiconductor memory device includes N-th wires 31, a (2N−1)-th interlayer insulating layer 32 formed over the N-th wires 31, a 2N-th interlayer insulating layer 33 formed over the (2N−1)-th interlayer insulating layer 32, stripe-shaped (N+1)-th wires 41 formed on the 2N-th interlayer insulating layer 33 such that the (N+1)-th wires 41 respectively cross the N-th wires 31 so as to be perpendicular to the N-th wires 31, a (2N+1)-th interlayer insulating layer 42 formed to cover the (N+1)-th wires 41, and the upper wires 13 formed over the (2N+1)-th interlayer insulating layer 42. N-th memory cell holes 34 are formed to penetrate the (2N−1)-th interlayer insulating layer 32 and the 2N-th interlayer insulating layer 33 in regions where the N-th wires 31 respectively cross the (N+1)-th wires 41 so as to be perpendicular to the (N+1)-th wires 41. Inside each N-th memory cell hole 34, a N-th resistance variable layer 35 connected to the N-th wire 31 and a lower electrode 37 of N-th diode element which is formed on the N-th resistance variable layer 35 are provided. The (N+1)-th wire 41 includes a semiconductor layer 40 of N-th diode element and a conductive layer 38 of (N+1)-th wire which has low resistivity. AN-th diode element 36 (MSM diode) is composed of the lower electrode 37 of N-th diode element, the semiconductor layer 40 of N-th diode element, and the upper electrode 39 of N-th diode element.

The first wire 2 is connected to the upper wire 13 via a stacked contact consisting of contacts stacked in N layers, from the first contact 14 penetrating the first interlayer insulating layer 3 and the second interlayer insulating layer 12 to a 2N-th contact 45 penetrating the 2N-th interlayer insulating layer 33 and the (2N+1)-th interlayer insulating layer 42. A K-th (K: integer from 2 to N: not shown) wire which is an intermediate wire layer is connected to the upper wire 13 via a stacked contact consisting of contacts stacked in (NK+1) layers, from a (2k−2)-th contact penetrating a (2K−2)-th interlayer insulating layer to the 2N-th contact 45. The (N+1)-th wire 41 is connected to the upper wire 13 via a (2N+1)-th contact 46 penetrating the (2N+1)-th interlayer insulating layer 42.

In such a configuration, since the wires except for the upper wire is connected to the upper wire via the contacts stacked in one or more layers, the wires except for the upper wire can be connected to each other via the upper wire as desired without the contacts used for directly connecting these wires. In addition, since a lead-out contact used for connecting the intermediate wire having the semiconductor layer or insulating layer as its lowermost layer to the underlying layer cannot be formed, electric connection between these wires is accomplished only via the upper wire, with the structure of the present invention. This makes it possible to omit a mask and process for removing predetermined region of the semiconductor layer or the insulating layer, for each individual layer. Therefore, it is possible to attain a nonvolatile semiconductor memory device which can ensure a sufficient current supply capability in the cross-point configuration including a combination of the diode element and the resistance variable layer, and can lead out the wire potential of the cross-point memory of a multi-layer structure, without making the process complicated and increasing the cost of the process.

Embodiment 4

Figure 4:
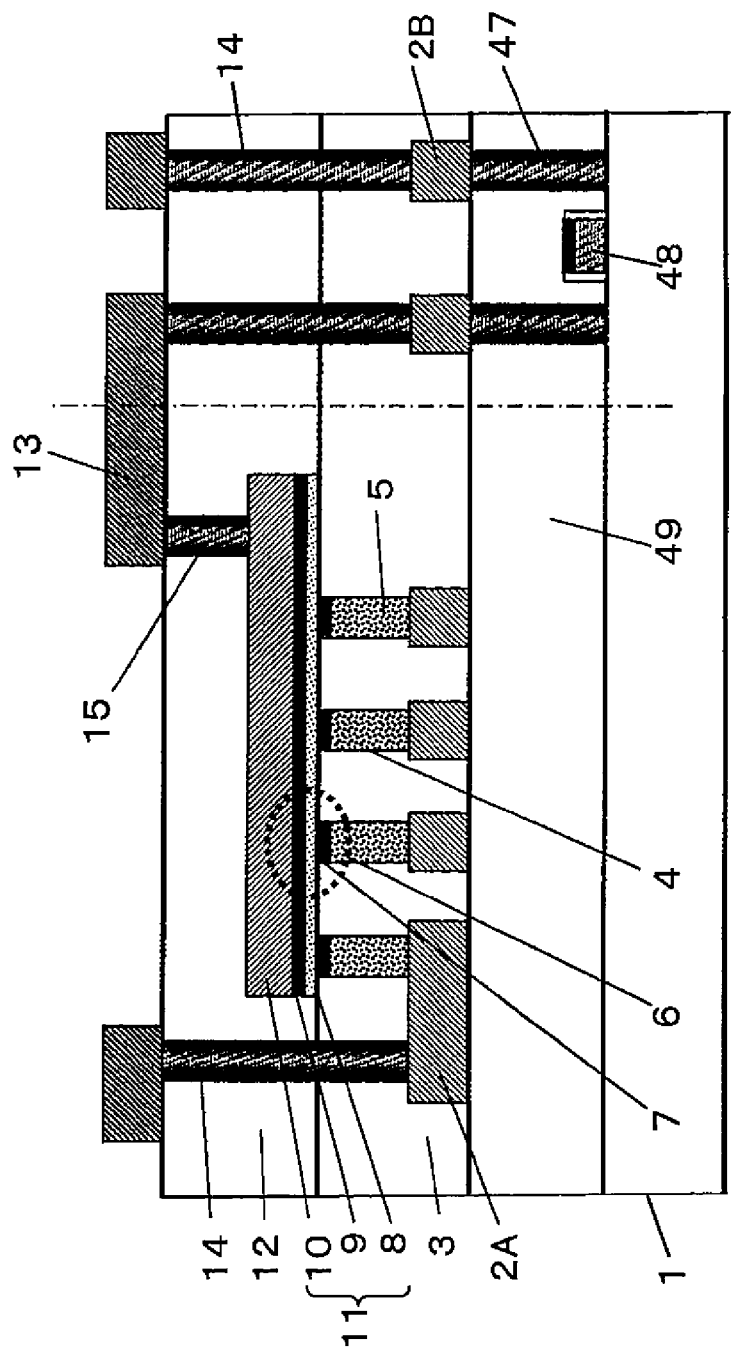
FIG. 4 is a cross-sectional view of a cross-point memory array of a single-layer structure including a peripheral circuit according to Embodiment 4 of the present invention.

FIG. 4 is a cross-sectional view showing a configuration of a nonvolatile semiconductor memory device according to Embodiment 4 of the present invention. Embodiment 4 is different from Embodiment 1 in that a peripheral circuit such as a transistor 48 is formed in a layer underlying the first interlayer insulating layer 3. The constituents common to Embodiment 1 and Embodiment 4 will not be described repetitively in this Embodiment. The nonvolatile semiconductor memory device includes, in addition to the constituents of Embodiment 1, the transistor 48 constituting the peripheral circuit of cross-point memory formed on the substrate 1, an insulating layer 49 which is formed on the substrate 1 to be located between the substrate and the wires and to cover the transistor 48, and a connection contact 47 penetrating the insulating layer 49 to connect the wires to the transistor. The first wire 2 includes a wire 2A of cross-point memory which is connected to the first resistance variable layer 5 and a wire 2B constituting a peripheral circuit for driving the cross-point memory. The wire 2A of cross-point memory and the wire 2B for peripheral circuit are both connected to the upper wire 13 via the first contact 14 penetrating the first interlayer insulating layer 3 and the second interlayer insulating layer 12. The transistor 48 is connected to the upper wire 13 via the connection contact 47, the wire 2B for peripheral circuit, and the first contact 14.

In such a configuration, the potential of the transistor for peripheral circuit for driving the cross-point memory array and the potential of the wire can be surely led out by the lead-out contact. Further, the first wire can be used as the wire constituting the peripheral circuit of cross-point memory array as well as the wire of cross-point memory array of the present invention. Therefore, it is possible to attain a nonvolatile semiconductor memory device which can ensure a sufficient current supply capability in the cross-point configuration including a combination of the diode element and the resistance variable layer, and can lead out the wire of the peripheral circuit of the cross-point memory array in addition to the wire of the cross-point memory, without making the process complicated and increasing the cost of the process.

Embodiment 5

Figure 5:
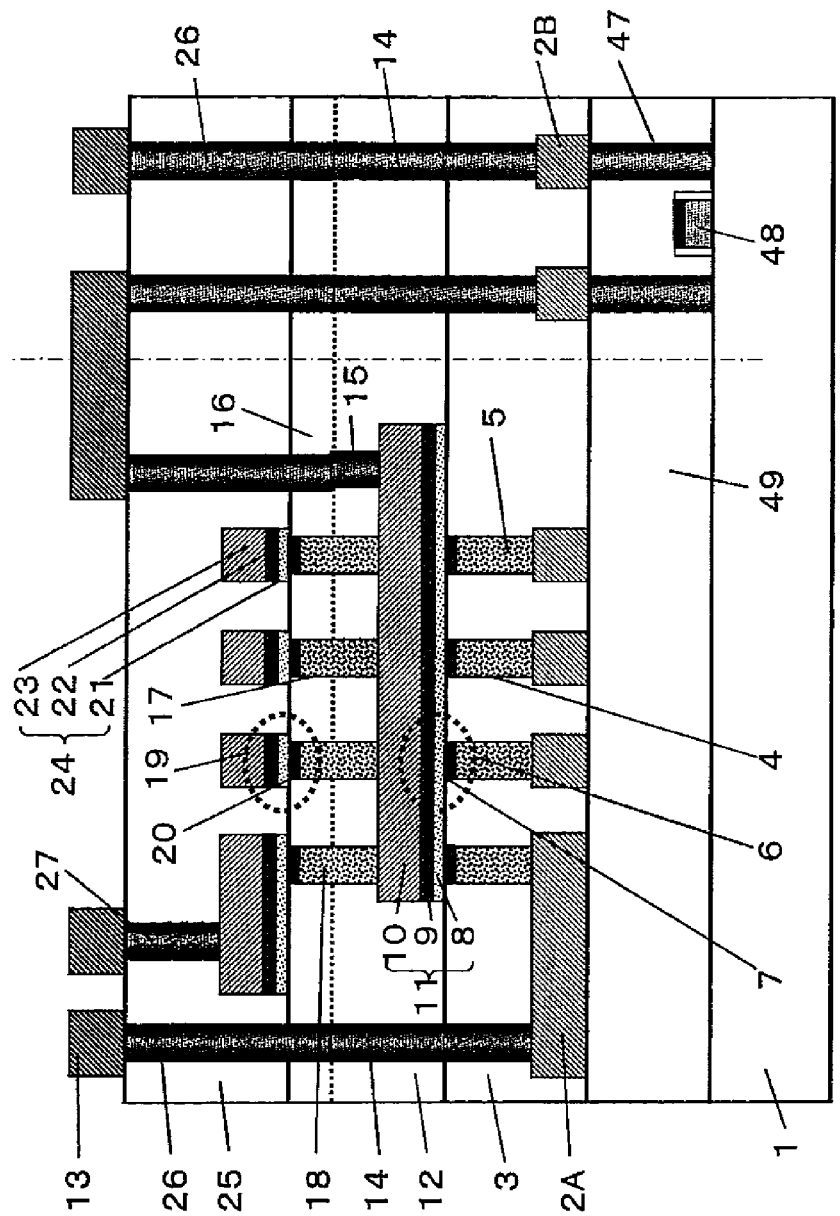
FIG. 5 is a cross-sectional view of a cross-point memory array of a layer structure including a peripheral circuit according to Embodiment 5 of the present invention.

FIG. 5 is a cross-sectional view showing a configuration of a nonvolatile semiconductor memory device according to Embodiment 5 of the present invention. Embodiment 5 is different from Embodiment 2 in that the peripheral circuit such as the transistor 48 is formed in the layer underlying the first interlayer insulating layer 3.

The constituents common to Embodiment 2 and Embodiment 5 will not be described repetitively in this Embodiment. The nonvolatile semiconductor memory device includes, in addition to the constituents of Embodiment 2, the transistors 48 constituting the peripheral circuits of cross-point memories formed on the substrate 1, an insulating layer 49 which is formed over the substrate 1 to be located between the substrate and the wires and to cover the transistors 48, and connection contacts 47 penetrating the insulating layer 49 to connect the wires to the transistors. Each first wire 2 includes the wire 2A of cross-point memory array which is connected to the first resistance variable layer 5 and the wire 2B constituting the peripheral circuit for driving the cross-point memory array. The wire 2A of cross-point memory array and the wire 2B for peripheral circuit are both connected to the upper wire 13 via the first contact 14 penetrating the first interlayer insulating layer 3 and the second interlayer insulating layer 12 and the third contact 26 penetrating the third interlayer insulating layer 16 and the fourth interlayer insulating 25. The transistor 48 is connected to the upper wire 13 via the connection contact 47, the wire 2B for peripheral circuit, the first contact 14, and the third contact 26.

In such a configuration, the potential of the transistor for peripheral circuit for driving the cross-point memory array and the potential of the wire can be surely led out by the stacked contact. Further, the first wire can be used as the wire for forming the peripheral circuit of cross-point memory array as well as the wire of cross-point memory array. Therefore, it is possible to attain a nonvolatile semiconductor memory device which can ensure a sufficient current supply capability in the cross-point configuration including a combination of the diode element and the resistance variable layer, and can lead out the wire of the peripheral circuit of the cross-point memory array in addition to the wires of the cross-point memory array, without making the process complicated and increasing the cost of the process.

Modification of Embodiment 1

Figure 6:
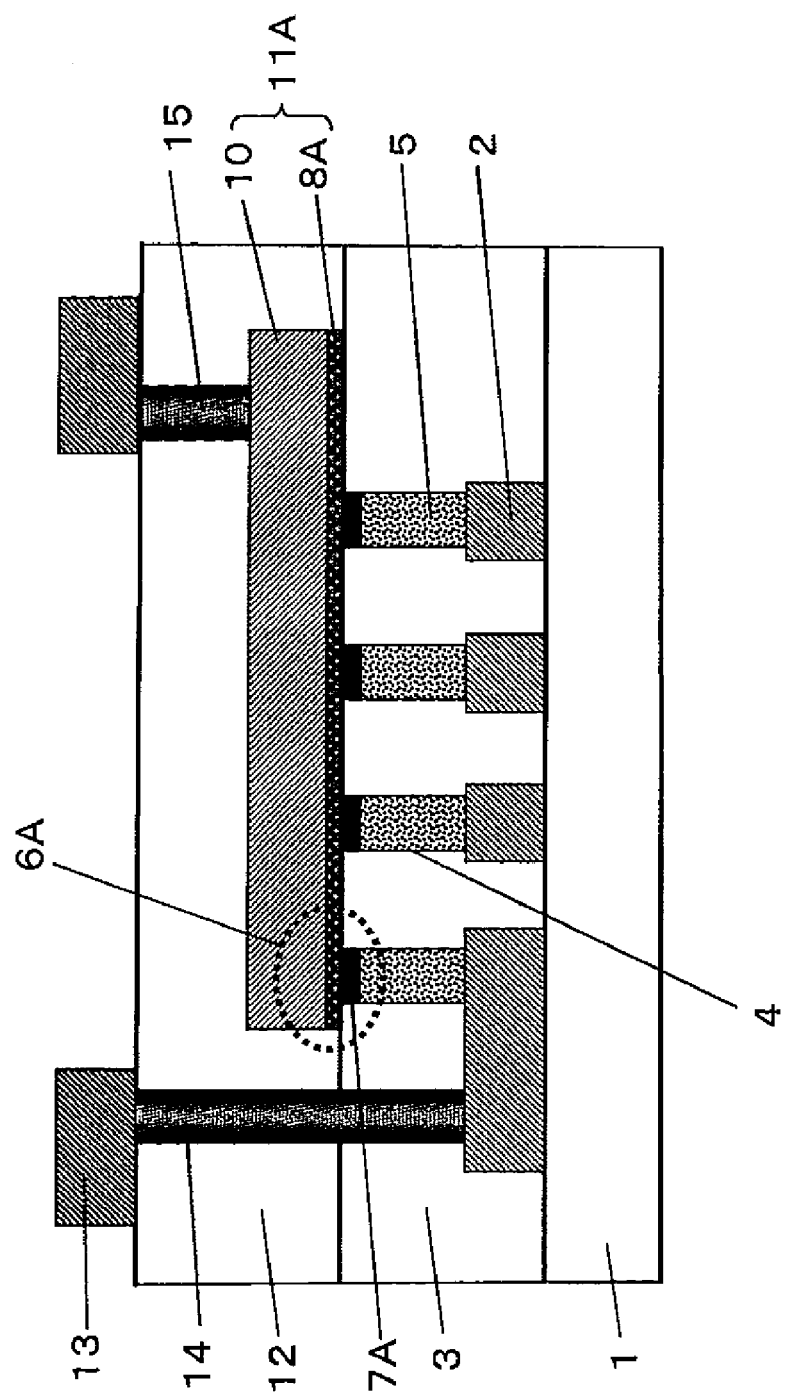
FIG. 6 is a cross-sectional view showing modification 1 of a cross-point memory array of a single-layer structure according to Embodiment 1 of the present invention.

FIG. 6 is a cross-sectional view showing modification 1 of the cross-point memory array having the single-layer structure according to Embodiment 1 of the present invention. Modification 1 is different from Embodiment 1 in that a metal electrode 7A of first diode element is filled into the first memory cell hole 4 and a second wire 11A has a layer structure consisting of a semiconductor 8A of first diode element and the conductive layer 10 of second wire which has low resistivity. A first diode element 6A which is a Schottky diode is composed of the metal electrode 7A and the semiconductor 8A. In the case of the configuration of the Schottky diode, since major carriers are dominant, a current supply capability of the diode can be increased and a high-speed operation can be achieved. This configuration is suitable for so-called a unipolar resistance variable layer which switches resistance in response to voltages with the same polarity and different magnitudes.

Figure 7:
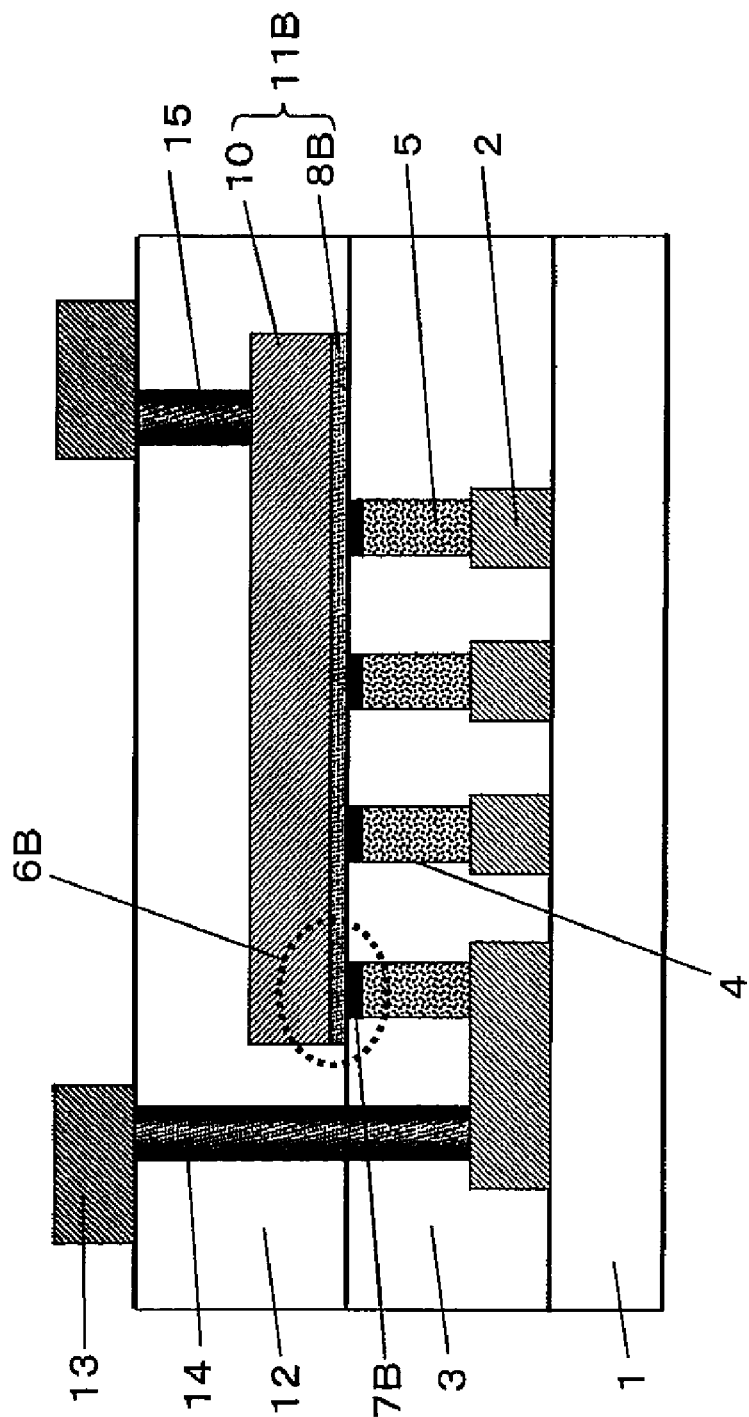
FIG. 7 is a cross-sectional view showing modification 2 of a cross-point memory array of a single-layer structure according to Embodiment 1 of the present invention.

FIG. 7 is a cross-sectional view showing modification 2 of the cross-point memory array having the single-layer structure according to Embodiment 1 of the present invention. Modification 2 is different from Embodiment 1 in that a n-type semiconductor layer 7B of first diode element is filled into the first memory cell hole 4 and a second wire 11B has a layer structure consisting of a p-type semiconductor layer 8B of first diode element and the conductive layer 10 of second wire which has low resistivity. A first diode element 6B which is a pn junction diode is composed of the n-type semiconductor layer 7B and the p-type semiconductor layer 8B. In the above configuration, the n-type semiconductor layer 7B and the p-type semiconductor layer 8B may be arranged in a reverse order. Although the current supply capability of the pn junction diode is smaller than that of the above mentioned diode because minor carriers are dominant in the pn junction diode, it is expected that an excess current is prevented and electric power consumption is reduced in the pn junction diode. This configuration is suitable for so-called a unipolar resistance variable layer which switches resistance in response to voltages with the same polarity and different magnitudes.

Manufacturing Method of Embodiment 1

Subsequently, a manufacturing method of the nonvolatile semiconductor memory device according to Embodiment 1 of the present invention will be described with reference to FIGS. 8(a)~8(e).

Figure 8:
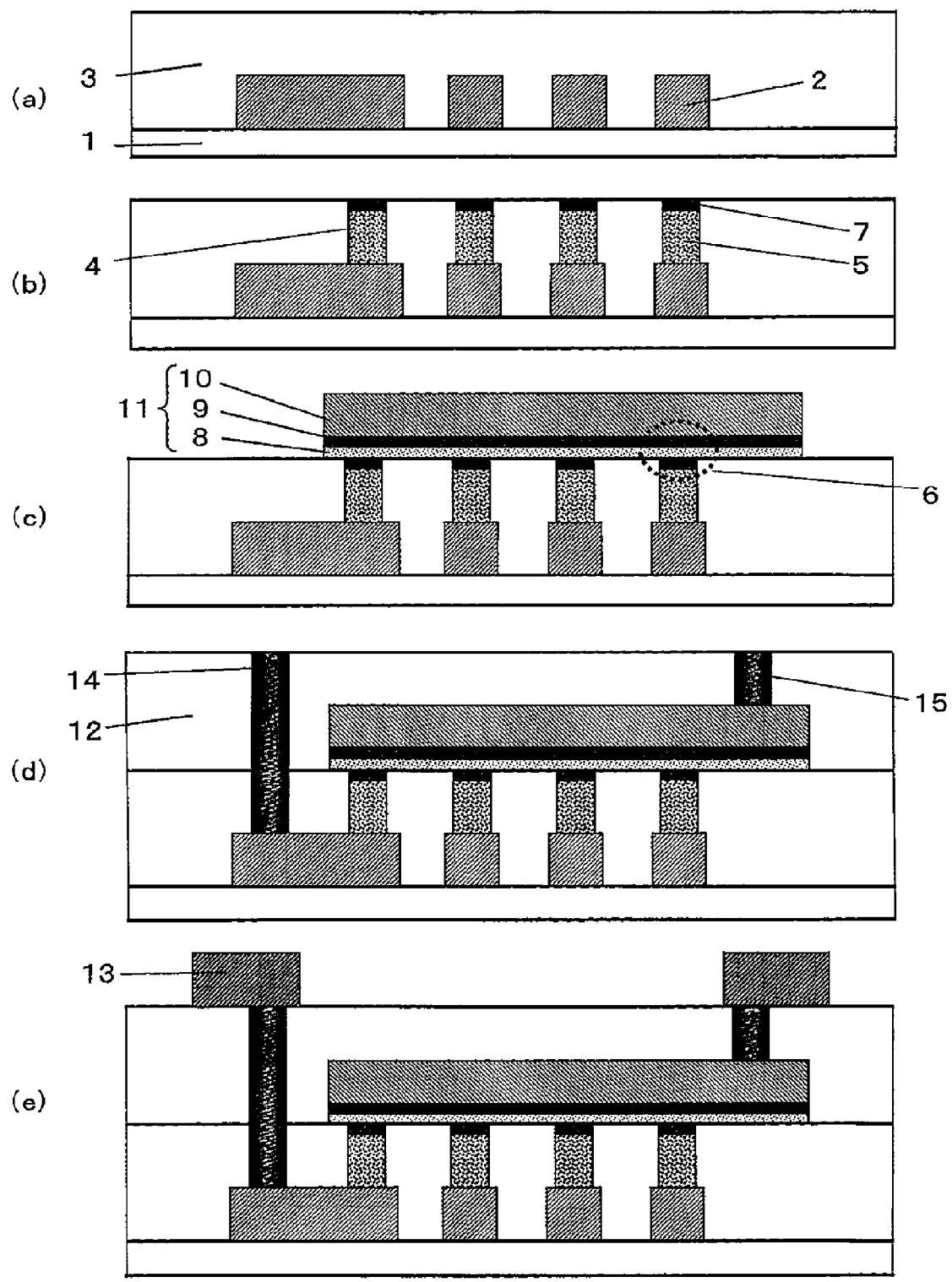
FIG. 8 is a process cross-sectional view for explaining a manufacturing method of a single-layer cross-point memory array according to Embodiment 1 of the present invention.

FIG. 8(a) is a process cross-sectional view showing a state where after the first wires 2 of a stripe shape are formed on the substrate 1 by patterning a conductive layer using a desired mask, the first interlayer insulating layer 3 is formed over the entire surface, and then the surface is planarized by CMP. Although aluminum was commonly used for the first wire 2 conventionally, copper which can implement low-resistance in a miniaturized configuration has been used recently. Fluorine-containing oxide (e.g., SiOF) or carbon-containing nitride (e.g., SiCN) is used for the first interlayer insulating layer 3 to reduce a parasitic capacitance between wires. In this Embodiment, for example, aluminum is used for the first wires 2 and SiOF which is the fluorine-containing oxide is used for the first interlayer insulating layer 3. Although the first wires 2 are formed by etching, they may be embedded in the first interlayer insulating layer 13. To be specific, after stripe-shaped trenches are formed in the first interlayer insulating layer 13 to allow the first wires 2 to be embedded therein and the conductive layer which becomes the first wires 2 are formed, the first wires 2 can be formed by a damascene process in which for example, CMP is conducted (similar damascene process may be used in the following wire forming steps.)

Then, as shown in FIG. 8(b), the first memory cell holes 4 are formed in the first interlayer insulating layer 3 on the first wires 2 at a constant arrangement pitch. If the width of the first wire 2 is smaller than the size of the first memory cell hole 4, the contact area of the first wire 2 and the first resistance variable layer 5 changes due to the misalignment between masks, causing a change in a cell current, for example. To prevent this, the width of the first wire 2 is set larger than the size of the first memory cell hole 4 in outer shape. Then, the first resistance variable layers 5 are filled into the first memory cell holes 4, respectively. As the first resistance variable layers 5, tantalum oxide is deposited by sputtering process. As the layer forming method, a CVD process, an ALD process, or the like may be used, instead of the sputtering. The resistance variable layer 5 is filled into each first memory cell hole 4 by the CMP process or an etch back process. Then, by conducting overpolishing or etch back, a portion of the first resistance variable layer 5 inside each first memory cell hole 4 is removed. Then, the lower electrode 7 of first diode element is formed in the upper portion of each first memory cell hole 4. Tantalum nitride is used for the lower electrode. As in the above described tantalum oxide, the layer of the tantalum nitride is deposited by the sputtering process, and is filled into each first memory cell hole 4 by using the CMP process or the etch back process.

Then, as shown in FIG. 8(c), the second wires 11 of a stripe shape are formed, each of which includes the semiconductor layer 8 and upper electrode 9 of first diode element and the conductive layer 10 of second wire which has low resistivity such that the semiconductor layer 8, the upper electrode 9 and the conductive layer 10 are stacked together. The second wires 11 are formed using a desired mask such that each second wire 11 is connected to the lower electrode 7 of first diode element and crosses the first wire 2 so as to be perpendicular to the first wire 2. In this case, it is preferable that the semiconductor layer 8 and the upper electrode 9 have a larger shape than at least the first memory cell hole 4, to increase a current supply capability of the diode element. In this Embodiment, tantalum nitride is used for the lower electrode 7 and the upper electrode 9, and SiN is used for the semiconductor layer 8. By conducting the sputtering process, the CVD process or the ALD process, a SiN thin layer which has a good semiconductive property and is dense can be easily formed. In this way, the first diode element (MSM diode) 6 can be formed.

Then, as shown in FIG. 8(d), the second interlayer insulating layer 12 is formed over the first interlayer insulating layer 3 to cover the second wires 12. The material of the second interlayer insulating layer 12 is the same as the material of the first interlayer insulating layer 3. Then, by pattering using a desired mask, the first contacts 14 each of which penetrates the first interlayer insulating layer 3 and the second interlayer insulating layer 12 and is connected to the first wire 2, and the second contacts 15 each of which penetrates the second interlayer insulating layer 12 and is connected to the second wire 11 are formed concurrently. Each of the first contact 14 and the second contact 15 has a layer structure, in which tungsten or copper and a combination of titanium, titanium nitride, tantalum and tantalum nitride which is a layer underlying the tungsten or copper are embedded and stacked together in the interlayer insulating layers. This can achieve a lead-out contact with a low contact resistance. Since the first contact 14 is deeper than the second contact 15, the second wire 11 at the bottom portion of the second contact 15 is over-etched for a time period that lapses until the etching has exposed the first wire 2 at the bottom portion of the first contact 14, when forming the first contact 14 and the second contact 15 concurrently using this mask. To prevent an influence of plasma damage or an influence occurring when the second contact 15 pierces into the second wire 11 during the etching, it is desirable to form the second contact 15 on the second wire 11 except for a region right above the first memory cell hole 4.

Finally, as shown in FIG. 8(e), the upper wires 13 are formed on the second interlayer insulating layer 12 using a desired mask such that each upper wire 13 is connected to the first contact 14 and the second contact 15. The upper wires 13 are made of the material similar to the material of the second wires 12. After that, an insulating protective layer (not shown) is formed, thereby manufacturing the nonvolatile semiconductor memory device according to Embodiment 1 of the present invention.

Manufacturing Method of Embodiment 2

Next, a manufacturing method of the nonvolatile semiconductor memory device according to Embodiment 2 of the present invention will be described with reference to FIGS. 9(a)~9(g). Since the steps for manufacturing the first layer of the cross-point memory array is similar to those of FIGS. 8(a)~8(d), they will not be described repetitively in this Embodiment. In addition, since the materials and others used for the wires, the interlayer insulating layers, the resistance variable layers, the diode elements and the contacts are already described in the manufacturing method of Embodiment 1 of the present invention, they will not be described repetitively in this Embodiment.

Figure 9:
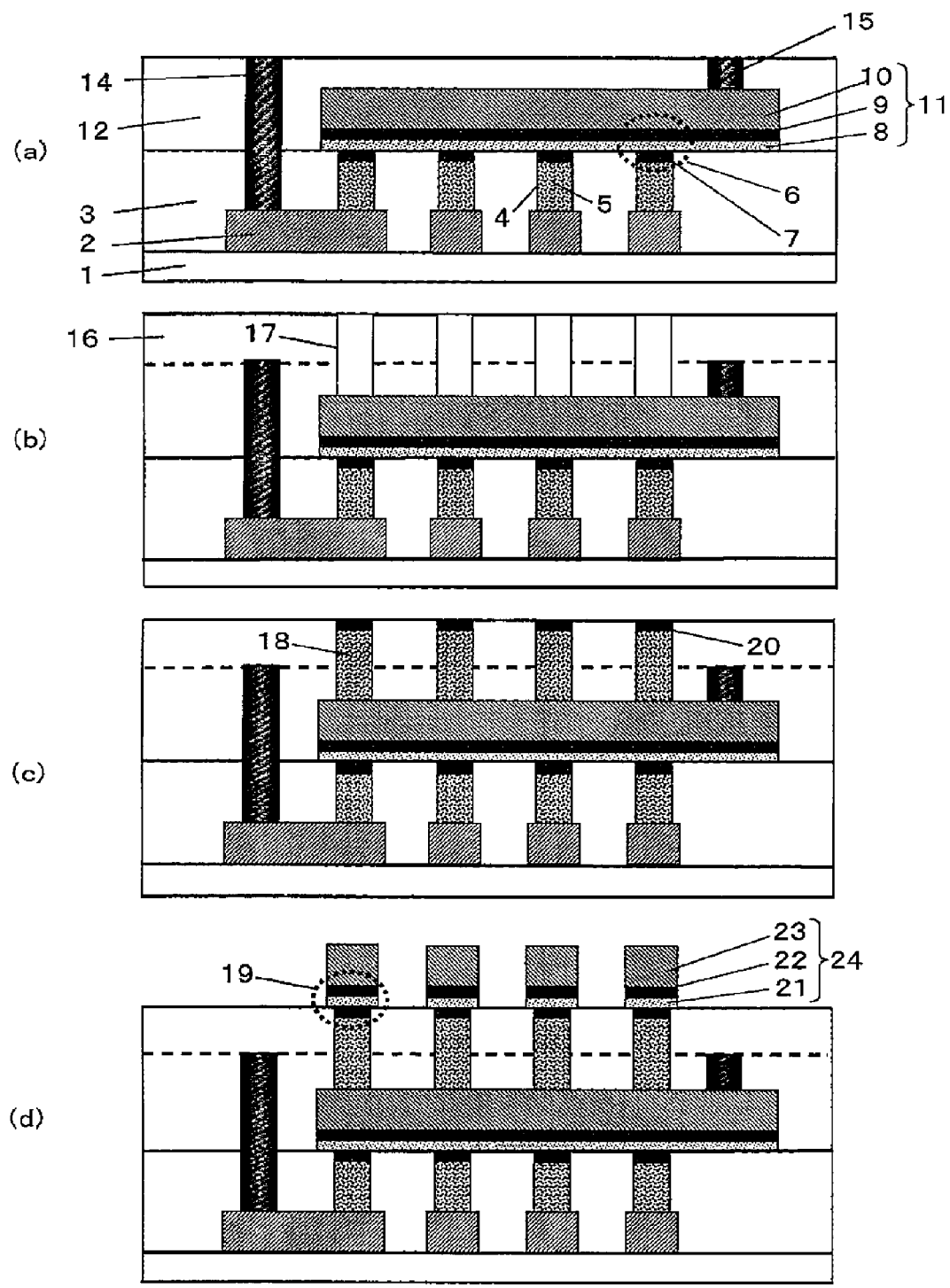
FIG. 9 is a process cross-sectional view for explaining a manufacturing method of a single-layer cross-point memory array according to Embodiment 2 of the present invention.

FIG. 9(a) shows a state where the first contact 14 penetrating the first interlayer insulating layer 3 and the second interlayer insulating layer 12 and connected to the first wire and the second contact 15 penetrating the second interlayer insulating layer 12 and connected to the second wire 11 are formed, as already described with reference to FIG. 8(d).

As shown in FIG. 9(b), the third interlayer insulating layer 16 is formed over the entire surface to cover the first contacts 14 and the second contacts 15. Then, the second memory cell holes 17 are formed at a constant arrangement pitch to penetrate the second interlayer insulating layer 12 and the third interlayer insulating layer 16 on the second wires 11. For the same reason for the first memory cell holes 4, the width of the second wire 11 is set larger than the size of the second memory cell hole 17 in outer shape. It is preferable that the second memory cell hole 17 is positioned right above the first memory cell hole 4, to achieve miniaturization in cell layout and to maintain symmetric property of upper and lower cells in the cross-point memory array, thereby suppressing a variation in a circuit operation. Since the surface of the first contact 14 and the surface of the second contact 15 are covered with the third interlayer insulating layer 16, the structure is not subjected to damage in process (property change of layer due to plasma damage, oxidation or cleaning) caused by dry etching or the like, for forming the second memory cell holes 17 in principle. Therefore, when forming the stacked contact thereafter, contacts which are electrically stable can be surely formed without a possibility of property change of the surfaces of the first contacts 14 or the surfaces of the second contacts 15 which would otherwise occur due to oxidation or cleaning. As a result, a yield of the nonvolatile memory device can be improved.

Then, as shown in FIG. 9(c), the second resistance variable layer 18 and the lower electrode 20 of second diode element are filled into each second memory cell hole 17 such that the lower electrode 20 is located at the upper portion of the resistance variable layer 18. Since the forming method of them is already described with reference to FIG. 8(b), it will not be described repetitively.

Then, as shown in FIG. 9(d), the third wires 24 of a stripe shape are formed, each of which includes the semiconductor layer 21 and upper electrode 22 of second diode element and the conductive layer 23 of third wire which has low resistivity such that the semiconductor layer 21, the upper electrode 22 and the conductive layer 23 are stacked together. The third wires 24 are formed using a desired mask such that each third wire 24 is connected to the lower electrode 20 of second diode element and crosses the second wire 11 so as to be perpendicular to the second wire 11. In this case, also, it is preferable that the semiconductor layer 21 and the upper electrode 22 have a larger shape than at least the second memory cell hole 17, to improve a current supply capability of the diode element. In this way, the second diode element (MSM diode) 19 can be formed.

Then, as shown in FIG. 10(a), the fourth interlayer insulating layer 25 is formed over the third interlayer insulating layer 16 to cover the third wires 24.

Figure 10:
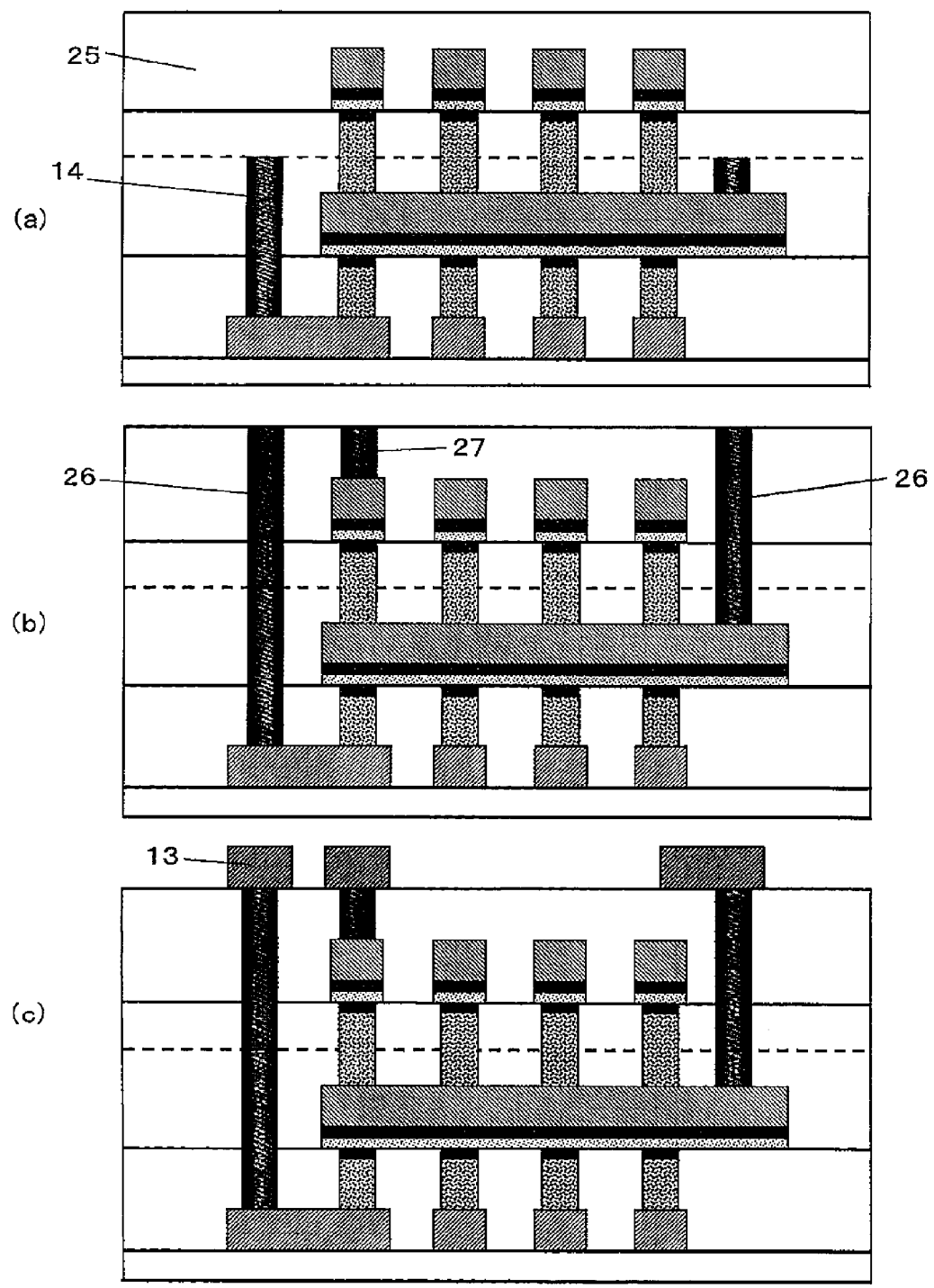
FIG. 10 is a process cross-sectional view for explaining a manufacturing method of the single-layer cross-point memory array according to Embodiment 2 of the present invention.
Figure 11:
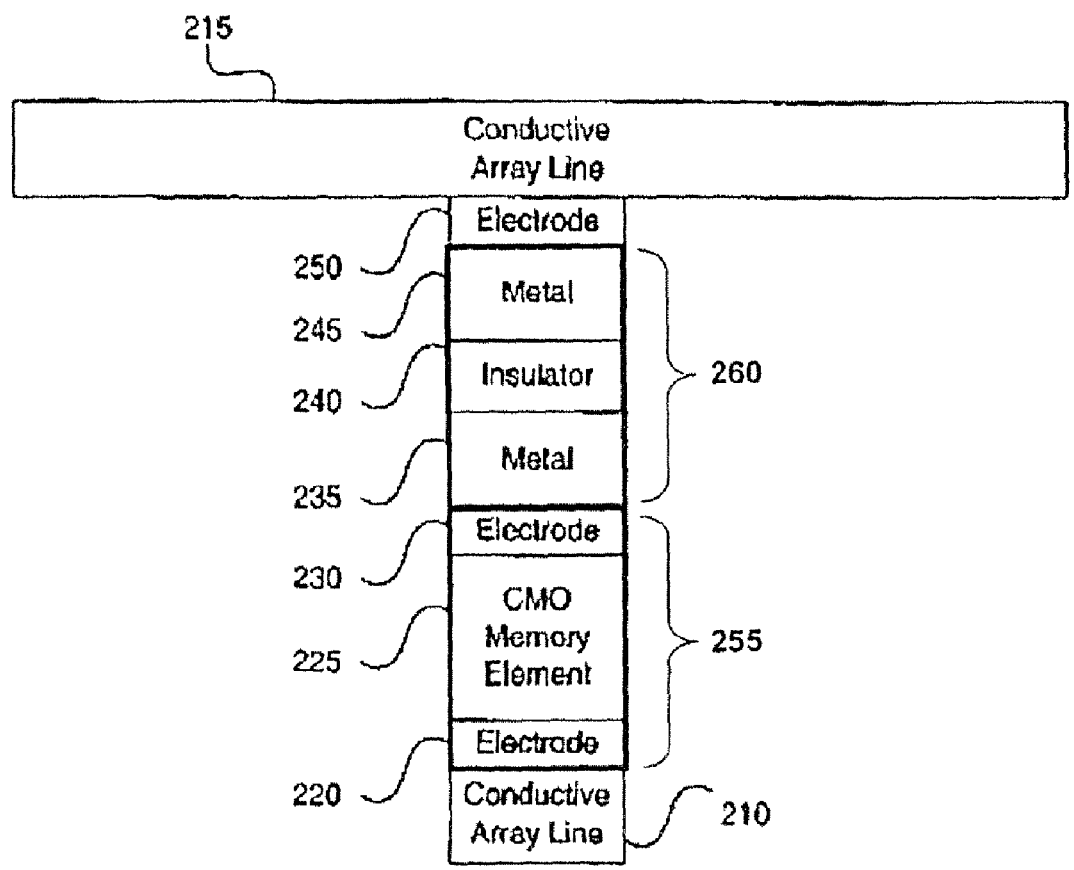
FIG. 11 is a cross-sectional view of a conventional example of a cross-point memory cell.

Then, as shown in FIG. 10(b), by patterning using a desired mask, the third contacts 26 each of which penetrates the third interlayer insulating layer 16 and the fourth interlayer insulating layer 25 and is connected to the first contact 14 and the second contact 15, and the fourth contacts 27 each of which penetrates the fourth interlayer insulating layer 25 and is connected to the third wire 11 are formed concurrently. The materials used for the third contact 26 and the fourth contact 27 are similar to the materials used for the above mentioned contacts. Since the third contact 26 is deeper than the fourth contact 27, the third wire 24 at the bottom portion of the fourth contact 27 is over-etched for a time period that lapses until the etching gas exposed the first contact 14 and the second contact 15 which are located at the bottom portion of the third contact 26, when the third contact 26 and the fourth contact 27 are etched concurrently using the same mask. To prevent an influence of plasma damage or an influence occurring when the fourth contact 27 pierces through the third wire 24 during the etching, it is desirable to form the fourth contact 27 on the third wire 24 except for a region right above the second memory cell hole 17. Although the fourth contact 27 is drawn as being located right above the second memory cell hole 17 in FIG. 10, it is formed in a region except for the region right above the second memory cell hole 17 in a depth direction.

Finally, as shown in FIG. 10(c), the upper wires 13 are formed on the fourth interlayer insulating layer 25 using a desired mask such that each upper wire 13 is connected to the third contact 26 and the fourth contact 27. The upper wires 13 are made of the material similar to the material of the first wires 2. After that, an insulating protective layer (not shown) is formed, thereby manufacturing the nonvolatile semiconductor memory device according to Embodiment 2 of the present invention as shown in FIG. 2

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention relates to a cross-point nonvolatile semiconductor memory device using diode elements and resistance variable layers, and achieves a nonvolatile memory having a very large memory capacity. Therefore, the present invention is useful in fields of various electronic hardware using nonvolatile memory devices.

The invention claimed is:
1. A nonvolatile semiconductor memory device comprising:
  a substrate;
  first wires of a stripe shape which are formed on the substrate;
  a first interlayer insulating layer formed over the first wires;
  first memory cell holes formed in the first interlayer insulating layer on the first wires;
  first resistance variable layers which are connected to the first wires via the first memory cell holes, respectively;
  first non-ohmic elements formed on the first resistance variable layers, respectively;
  second wires of a stripe shape which are formed on the first interlayer insulating layer such that the second wires respectively cross the first wires to be perpendicular to the first wires;
  a second interlayer insulating layer formed over the second wires;
  a third interlayer insulating layer formed over the second interlayer insulating layer;
  second memory cell holes penetrating the second interlayer insulating layer and the third insulating layer on the second wires;
  second resistance variable layers connected to the second wires via the second memory holes, respectively;
  second non-ohmic elements formed on the second resistance variable layers, respectively;
  third wires of a stripe shape which are formed on the third interlayer insulating layer such that the third wires respectively cross the second wires so as to be perpendicular to the second wires;
  a fourth interlayer insulating layer formed over the third wires; and
  upper wires formed on the fourth interlayer insulating layer;

wherein each of the second wires has a plurality of layers including at least a portion of the first non-ohmic element and has an electrically-conductive layer in an uppermost layer of the second wire and a semiconductor layer or an insulator layer which is a portion of the first non-ohmic element in a lowermost layer of the second wire, and each of the third wires has a plurality of layers including at least a portion of the second non-ohmic element and has an electrically-conductive layer in an uppermost layer of the third wire and a semiconductor layer or an insulator layer which is a portion of the second non-ohmic element in a lowermost layer of the third wire;

wherein the uppermost layer of each of the second wires is connected to the upper wire via a stacked contact including a second contact penetrating the second interlayer insulating layer and the third contact penetrating the third interlayer insulating layer and the fourth interlayer insulating layer, the second contact and the third contact being stacked together;

and wherein the uppermost layer of each of the third wires is connected to the upper wire via a fourth contact penetrating the fourth interlayer insulating layer.

2. The nonvolatile semiconductor memory device according to claim 1, further comprising:

one or more constituent units being stacked together, each of the constituent units including the second interlayer insulating layer, the third interlayer insulating layer, the second resistance variable layer and the second non-ohmic element which are filled into the second memory cell hole, and the third wire;

wherein wires other than the upper wire are connected to the upper wire via contacts stacked in a form of one or more layers;

and wherein intermediate wires other than the upper wire and a lowermost wire are electrically connected to each other only via the upper wire.

3. The nonvolatile semiconductor memory device according to claim 1, wherein the stacked contact including the contacts stacked in the form of one or more layers is configured such that the contacts are connected to each other at a height position which is between upper and lower wire layers.

4. A method of manufacturing a nonvolatile semiconductor memory device comprising the steps of:

forming first wires of a stripe shape on a substrate;

forming a first interlayer insulating layer over the substrate provided with the first wires;

forming first memory cell holes in predetermined positions of the first interlayer insulating layer on the first wires, respectively;

filling first resistance variable layers into the first memory cell holes, respectively;

filling at least one layer of a layer structure forming a first non-ohmic element on each of the first resistance variable layers which are filled into the first memory cell holes, respectively;

forming second wires on the first interlayer insulating layer such that each of the second wires covers at least a portion of the first memory cell hole, an uppermost layer of the second wire is an electrically-conductive layer and a lowermost layer of the second wire is a semiconductor layer or an insulator layer, each of the second wires including other layer of the layer structure forming the first non-ohmic element;

forming a second interlayer insulating layer over the first interlayer insulating layer provided with the second wires;

forming first contacts on the first wires such that each of the first contacts penetrates the first interlayer insulating layer and the second interlayer insulating layer and second contacts on the second wires such that each of the second contacts penetrates the second interlayer insulating layer, the first contacts and the second contacts being formed concurrently;

forming a third interlayer insulating layer over the second interlayer insulating layer, surfaces of the first contacts and surfaces of the second contacts;

forming second memory cell holes in predetermined positions on the second wires such that each of the second memory cell holes penetrates the second interlayer insulating layer and the third interlayer insulating layer;

filling second resistance variable layers into the second memory cell holes, respectively;

filling at least one layer of a layer structure forming a second non-ohmic element on each of the second resistance variable layers which are filled into the second memory cell holes, respectively;

forming third wires on the third interlayer insulating layer such that each of the third wires covers at least a portion of the second memory cell hole, an uppermost layer of the third wire is an electrically-conductive layer and a lowermost layer of the third wire is a semiconductor layer or an insulator layer, each of the third wires including other layer of the layer structure forming the second non-ohmic element;

forming a fourth interlayer insulating layer over the third interlayer insulating layer provided with the third wires; and forming third contacts penetrating the third interlayer insulating layer and the fourth interlayer insulating layer over the first contacts and the second contacts, and fourth contacts penetrating the fourth interlayer insulating layer over the third wires such that the third contacts and the fourth contacts are formed concurrently; and forming upper wires on the fourth interlayer insulating layer such that each of the upper wires is connected to the third contact and the fourth contact.

5. The nonvolatile semiconductor memory device according to claim 1, wherein each of the second wires and each of the third wires are electrically connected to a transistor constituting a peripheral circuit of a cross-point memory formed on the substrate only via the upper wire.

* * * * *